United States Patent
Farnworth et al.

(10) Patent No.: US 6,632,343 B1
(45) Date of Patent: Oct. 14, 2003

(54) METHOD AND APPARATUS FOR ELECTROLYTIC PLATING OF SURFACE METALS

(75) Inventors: Warren M. Farnworth, Nampa, ID (US); Kevin G. Duesman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 40 days.

(21) Appl. No.: 09/651,040

(22) Filed: Aug. 30, 2000

(51) Int. Cl.⁷ .................................................. C25D 5/02
(52) U.S. Cl. ........................ 205/125; 205/118; 205/220; 205/224
(58) Field of Search ........................... 428/209; 205/118, 205/125, 220, 224

(56) References Cited

U.S. PATENT DOCUMENTS

| | | | |
|---|---|---|---|
| 3,099,608 A | * 7/1963 | Radovsky et al. ............ 204/15 |
| 4,581,301 A | 4/1986 | Michaelson |
| 5,004,639 A | 4/1991 | Desai |
| 5,256,598 A | * 10/1993 | Farnworth et al. .......... 437/220 |
| 5,287,619 A | 2/1994 | Smith et al. |
| 5,343,616 A | 9/1994 | Roberts |
| 5,349,500 A | 9/1994 | Casson et al. |
| 5,364,707 A | 11/1994 | Swisher |
| 5,439,986 A | * 8/1995 | Hosogane et al. .......... 525/530 |
| 5,467,252 A | 11/1995 | Nomi et al. |
| 5,477,612 A | 12/1995 | Roberts |
| 5,528,001 A | 6/1996 | Roberts |
| 5,545,308 A | * 8/1996 | Murphy et al. ............. 205/125 |
| 5,549,808 A | * 8/1996 | Farooq et al. .............. 205/123 |
| 5,567,295 A | 10/1996 | Swamy et al. |
| 5,584,120 A | 12/1996 | Roberts |
| 5,615,477 A | 4/1997 | Sweitzer |
| 5,681,441 A | * 10/1997 | Svendsen et al. ........... 205/114 |
| 5,709,979 A | 1/1998 | Casson et al. |
| 5,779,921 A | * 7/1998 | Haslow et al. .............. 205/125 |
| 5,789,320 A | 8/1998 | Andricacos et al. |
| 5,800,650 A | 9/1998 | Anderson et al. |
| 5,819,579 A | 10/1998 | Roberts |
| 5,840,402 A | 11/1998 | Roberts et al. |
| 5,950,305 A | 9/1999 | Roberts |
| 5,981,311 A | 11/1999 | Chia et al. |
| 5,990,547 A | 11/1999 | Sharma et al. |
| 6,015,482 A | * 1/2000 | Stern .......................... 205/125 |
| 6,017,967 A | * 1/2000 | Matijevic et al. ............. 516/96 |
| 6,355,153 B1 | * 3/2002 | Uzoh et al. ................... 205/87 |

* cited by examiner

*Primary Examiner*—Cathy Lam
(74) *Attorney, Agent, or Firm*—Winstead Sechrest & Minick; Hugh R Kress

(57) ABSTRACT

A method and apparatus for electrolytic plating of selected areas of printed circuit board traces is disclosed. The method is characterized by its elimination of the need for plating bus bars and plating contacts on the printed circuit board to facilitate a spot-plating process. In one embodiment, a printed circuit board substrate is provided which is at least partially conductive, such that a plating voltage may be applied to any one or more points on the substrate during a spot plating operation. In another embodiment, the substrate material is initially partially conductive, but following the spot-plating operation, is subjected to a curing treatment or the like to cause degeneration of the substrate's conductivity. Carbon-impregnated polyimide, partially-cured polyimide, FR4 or FR5, with appropriate contaminants introduced therein are contemplated as materials suitable for a printed circuit board substrate in accordance with the invention. In another embodiment, the traces are first applied to the partially conductive substrate by an electroplating operation wherein an electroplating voltage is applied to the substrate such that the substrate itself serves as one terminal of the electroplating system.

5 Claims, 4 Drawing Sheets

METHOD AND APPARATUS FOR ELECTROLYTIC PLATING OF SURFACE METALS

FIELD OF THE INVENTION

This invention relates generally to the field of electronic devices, and more particularly relates to electrolytic plating of metals onto printed circuit boards and the like.

BACKGROUND OF THE INVENTION

Those of ordinary skill in the art will be familiar with numerous applications involving the mounting and interconnecting of electronic components, such as semiconductor devices and the like, onto printed circuit boards. A printed circuit board (PCB) consists essentially of a sheet of insulating substrate, such as phenolic, glass-impregnated epoxy, polyimide, FR4, FR5, or the like, having a predefined pattern of thin conductive paths disposed on one or both sides. The conductive paths, sometimes referred to as "traces," are typically made of a metal, and define electrical connections between components such as integrated circuits mounted on the PCB.

Existing and emerging technologies are increasingly making use of PCBs. Cases in point include the so-called "board-on-chip" and "chip-on-board" semiconductor device mounting technologies, in which individual semiconductor dies are mounted directly onto (or vice versa) a PCB without prior encapsulation of the dies. Board-on-chip and chip-on-board technologies advantageously allow for greater densities of electronic components to be mounted in a given PCB area as compared with pre-encapsulated device mounting technologies, including surface-rib mount approaches. Higher device densities, in turn, lead to desirable miniaturization of electronic products.

At present, copper is the most prevalent metal used to form conductive metal PCB traces. Various techniques are known for forming copper PCB traces. These include a subtractive process, in which a sheet of copper is laminated to the surface of the PCB substrate and then selectively etched away leaving the desired pattern of traces, and an additive process in which copper is plated onto the PCB substrate in the desired pattern, such that no subsequent etching is required. U.S. Pat. No. 4,581,301 to Michaelson entitled "Additive Adhesive Based Process for the Manufacture of Printed Circuit Boards" provides a fair overview of various trace-forming techniques for PCB manufacture.

In some applications, it is known to be desirable for selected portions of copper PCB traces to be subsequently plated with another metal, for example a precious metal. Although copper is a very good electrical conductor, its conductivity is inferior to other materials. In applications where minimizing electrical resistance may be particularly critical, introduction of a metals with a conductivity better than that of copper may be beneficial. Furthermore, in some applications it is necessary to perform a so-called wire-bonding operation in which a very fine wire is applied to extend from a bond pad on a semiconductor device to a specific location on a PCB trace, and it is known to those of ordinary skill in the art that copper is a less than ideal metal for establishing a wire bond. Making PCB traces entirely out of a material other than copper, for example, silver or gold, would eliminate this problem, but in most cases would be prohibitively expensive and could give rise to other manufacturing issues. Accordingly, it is sometimes desirable to introduce a metal more conducive to wire bonding at selected discrete sites on PCB traces.

Various methods for selectively applying precious metals onto copper PCB traces are known to those of ordinary skill in the art, with the most prevalent methods involving anodic or cathodic electrolytic plating. To accomplish such selective plating, the surface of the PCB must first be masked to leave exposed only the selected areas to be plated. A sufficiently large positive or negative plating voltage is then applied to the traces and the PCB is immersed in a plating bath containing the precious metal. The precious metal is electrolytically attracted to and bonded to the exposed selected metal trace areas, while the remaining masked areas are left undisturbed. Once the desired areas have been plated, the mask layer may be removed.

One difficulty which can arise with electrolytic plating of precious metals onto PCB traces relates to the application of the plating voltages to the traces during the electrolytic plating process. More often than not, a PCB will have multiple electrically isolated copper traces formed thereon, and the traces are likely to be dispersed across the entire surface of the PCB. In order to spot-plate metals onto more than one separate trace, some means must be provided for applying the necessary electroplating voltage to each trace. Moreover, to facilitate the plating process, the electroplating voltage is preferably applied at a point at or substantially near the periphery of the PCB, whereas some traces to be spot-plated may not extend to the periphery of the PCB.

To address these issues, one approach taken in the prior art is to provide a plating bus bar for each trace (or at least for each trace upon which plating is to occur), with each bus bar extending to a single common plating voltage contact located at or near an edge of the PCB. During the plating process, the plating voltage is applied to the common plating voltage contact, with the plating voltage being conducted to each trace to be plated via a respective plating bus bar. After completion of the plating process, a further etching step is performed to sever or decouple the various plating bus bars at strategic locations so as to electrically disconnect the respective trace from the common plating voltage contact.

There are several potential disadvantages to this approach. First, the need to provide plating bus bars consumes valuable area on the PCB can interfere with the overall layout of the traces. This can have an undesirable adverse impact upon the overall necessary size of PCBs, and, consequently upon the size of the electronic devices into which the PCBs are to be installed.

Another potential drawback of providing plating bus bars to facilitate spot-plating of precious metals relates to the process of decoupling the bus bars from the operational traces once the bus bars have performed their intended function in the plating process. As noted above, one common method of decoupling the bus bars involves an extra etching step in which the bus bar is etched away at some point. Typically, this etching step involves selectively masking the PCB leaving small "windows" over the bus bars to be severed, and then applying an etchant to remove the metal exposed in those windows.

In addition to undesirably adding an extra masking step and an extra etching step to the PCB fabrication process, the process of decoupling the bus bars presents certain technical challenges. As those of ordinary skill in the art will appreciate, modern PCBs can have a great many traces formed thereon, and these traces may be very small and closely spaced. As a its result, the alignment of the masking layer applied to expose only the windows within which the bus bars are to be severed becomes quite critical. Misalignment of the mask can lead to the severing of traces not intended to be severed and/or to the failure to sever the plating bus bars as intended.

A further potential drawback to the need for providing bus bars for electrolytic plating relates to the electrical characteristics of the traces once the bus bars have been decoupled. Ideally, a bus bar would be severed at a strategic location such that after being severed, the trace that the bus bar served to couple to the plating contact would appear and function electrically as if no bus bar had ever been present. In practical application, on the other hand, this may not always be the case. Often, after a bus bar has been severed, some amount of the bus bar will remain extending from the trace to which it connected; this extending portion is sometimes referred to as a "plating stub." A plating stub may be formed, for example, if the mask window through which the plating bus bar is severed is disposed any distance from the trace itself. This is another example of how alignment of the post-plating mask layer can be critical. Misalignment of this mask prior to the severing etch can undesirably lead to the formation of plating stubs.

It has been observed in the prior art that the presence of plating stubs on PCB traces can adversely affect the electrical performance of the PCB. In modern electronic devices, the electrical signals carried on PCB traces may be very small, and the traces themselves may be very small and closely-spaced. This renders a typical PCB and the components mounted thereon extremely susceptible to capacitive coupling effects and the like. For a given trace pattern on a PCB, the electrical characteristics of the traces may be different depending upon whether plating stubs are present, and even upon the size of the plating stubs, which can be difficult to consistently control as a result of the above-noted mask alignment issues. Moreover, the presence of the portions of the bus bars not etched away during the decoupling process can have adverse capacitive effects upon the operational traces.

SUMMARY OF THE INVENTION

In view of the foregoing considerations, the present invention is directed in one respect to a method and apparatus for electrolytic spot-plating of metals onto PCB traces which eliminates the need for plating bus bars, and hence eliminates the formation of plating stubs at the completion of the plating and bus bar severing processes.

In accordance with one aspect of the invention, a PCB substrate is provided that, at least during the plating process, is sufficiently conductive to supply the plating voltage to the various traces formed on the PCB.

In accordance with another embodiment of the invention, a PCB substrate is provided that, subsequent to the plating process can be rendered non-conductive, such that the PCB and the components mounted thereon are permitted to operate properly.

BRIEF DESCRIPTION OF THE DRAWINGS

The foregoing and other features and aspects of the present invention will be best understood with reference to the following detailed description of a specific embodiment of the, invention, when read in conjunction with the accompanying drawings, wherein.

DETAILED DESCRIPTION OF A SPECIFIC EMBODIMENT OF THE INVENTION

In the disclosure that follows, in the interest of clarity, not all features of actual implementations are described. It will of course be appreciated that in the development of any such actual implementation, as in any such project, numerous engineering and design decisions must be made to achieve the developers' specific goals and subgoals (e.g., compliance with system- and business-related constraints), which will vary from one implementation to another. Moreover, attention will necessarily be paid to proper engineering and design practices for the environment in question. It will be appreciated that such a development effort might be complex and time-consuming, but would nevertheless be a routine undertaking for those of ordinary skill in the relevant fields.

Figure 1:
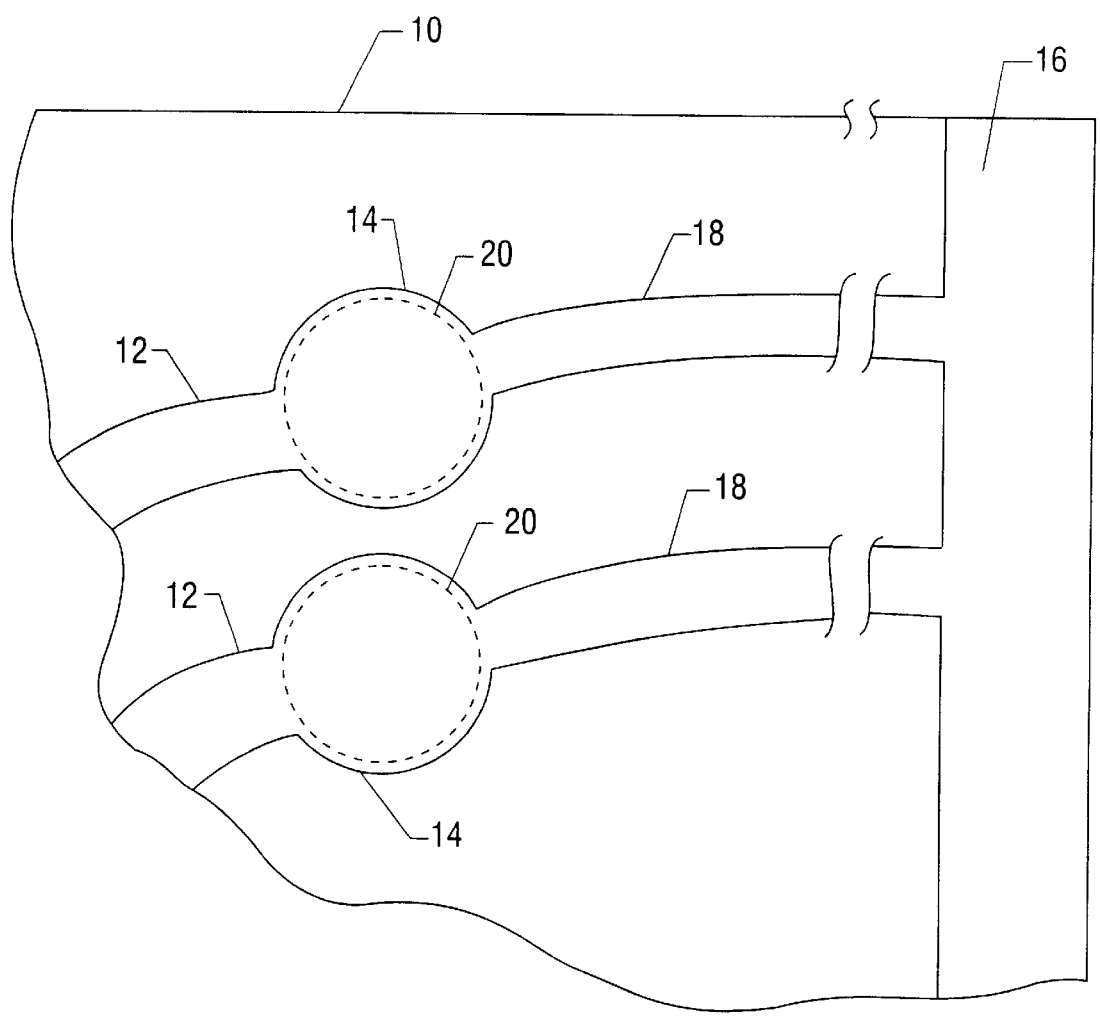
FIG. 1 is a view of a portion of a printed circuit board substrate having metal traces and bond pads formed thereon.

Referring to FIG. 1, there is shown an enlarged portion of a printed circuit board (PCB) 10 adapted for spot-plating of traces thereon using a prior art technique requiring plating bus bars. PCB 10 has a plurality of copper traces 12 thereon, each terminating in a contact pads 14. (Only two traces 12 and two contact pads 14 are shown in FIG. 1, it being understood that a PCB may is have considerably many more than this thereon. Further, it is to be understood that for the sake of at clarity, the dimensions of FIG. 1 are greatly enlarged; a typical contact pad 14, for example, may be only a few millimeters in diameter, or less.)

FIG. 1 further shows a plating contact 16 extending along one edge of PCB 10, as well as plating bus bars 18 extending from contact pads 14 to plating contact 16. In one embodiment, traces 12, bond pads 14, plating bus bars 18 and plating contact 16 are each made of copper, and are formed upon the substrate of PCB 10 in a conventional manner. Other metals, such as nickel, may also be used; the selection of materials comprising the traces 12, bond pads 14, bus bars 18 and plating contact 16 is not believed to be of any particular significance to the present invention, and it is believed that those of ordinary skill in the art having the benefit of the present disclosure will appreciate how this invention may be advantageously practiced with materials other than copper or the other metals mentioned herein.

In accordance with conventional practice plating bus bars 18 function to provide an electrical connection between plating contact 16 and bonding pads 14 upon which another metal is to be plated. The spot-plating process begins with the application of a mask layer over the entire substrate of PCB 10, with windows formed in the mask layer to expose the areas to be spot-plated. In FIG. 1, spot-plating windows in the mask layer are defined within the areas enclosed by dashed lines 20.

Figure 2:
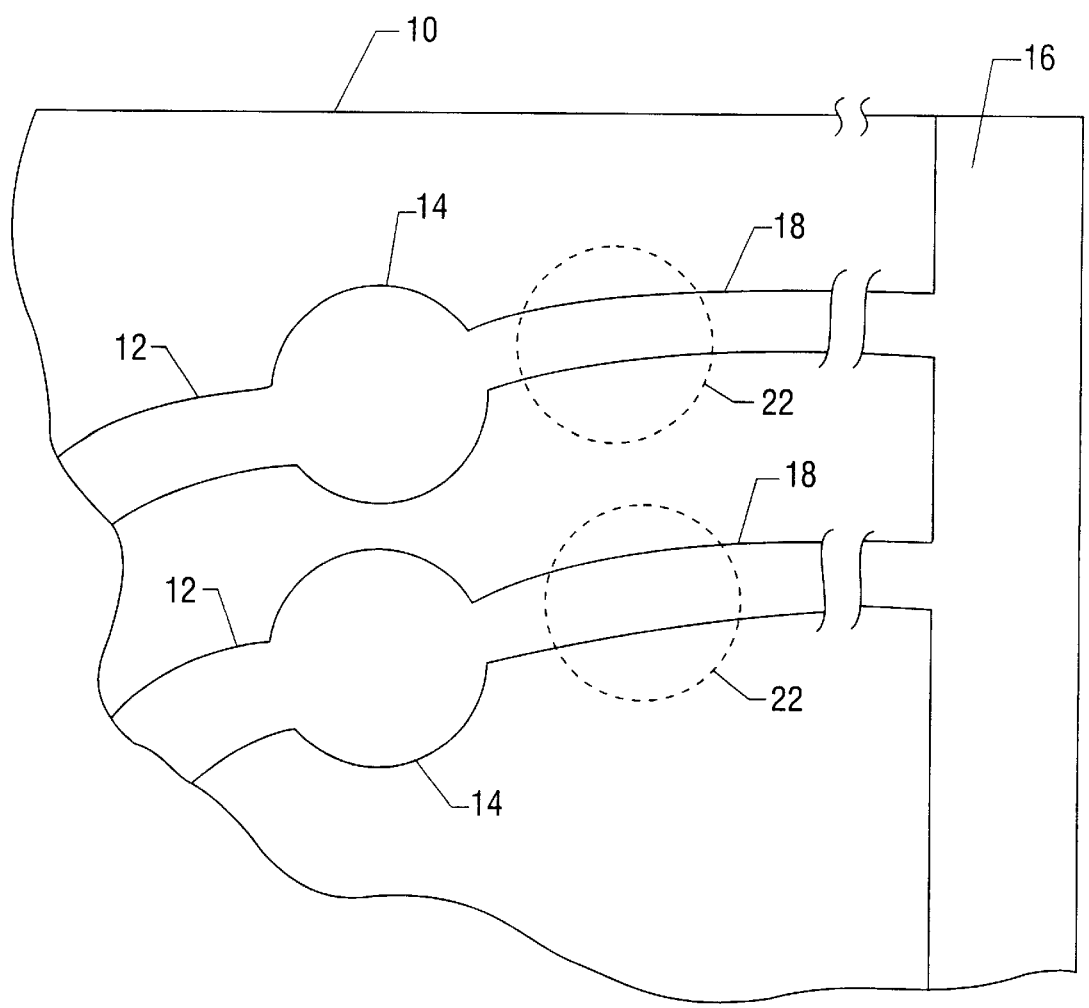
FIG. 2 is a view of the portion of printed circuit board from FIG. 1 during a plating bus bar decoupling process.

Once the spot-plating has been accomplished, the mask layer is removed using conventional techniques. Next, it is necessary to decouple traces 12 and bond pads 14 from plating contact 16 by severing plating buses 18. This requires application of another mask layer upon the substrate of PCB 10, with windows therein to expose some portion of each plating bus to be severed. In FIG. 2, such windows are defined within the areas enclosed by dashed lines 22. From FIG. 2, it is readily apparent why alignment of the mask layer is critical. If the mask is misaligned, plating bus decoupling may not successfully occur.

Figure 3:
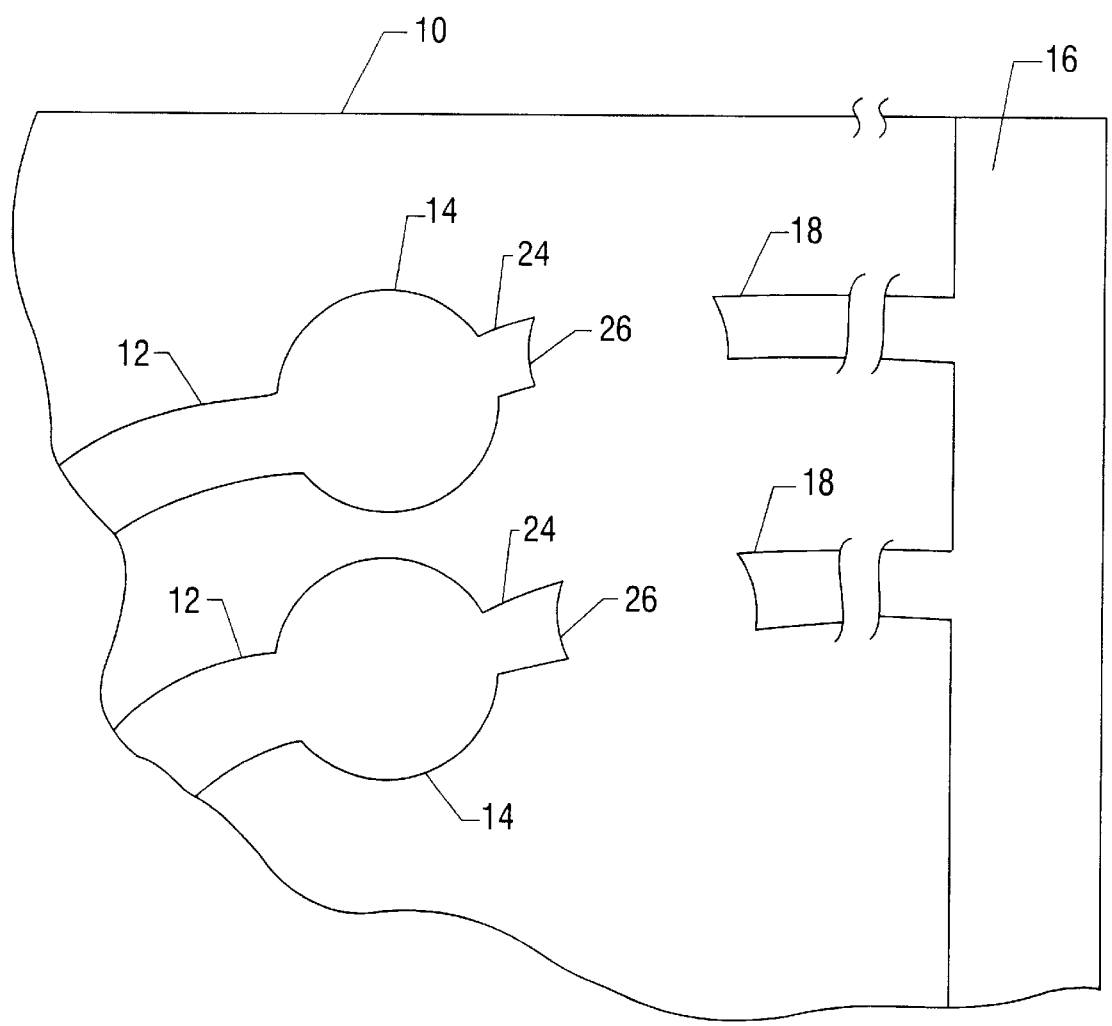
FIG. 3 is a view of the portion of the printed circuit board from FIG. 1 after completion of a plating bus bar decoupling process.

Once the mask layer has been applied, PCB 10 is subjected to an etching step in order to etch away the portions of plating buses 18 exposed through windows 22. After etching, PCB 10 is in the condition shown in FIG. 3. In particular, from FIG. 3 it is apparent that some length of each plating bus 18 remains. In addition, it can be seen that as a result of the locations of mask windows 22, an additional length of each plating bus continues to extend away from bond pad 14. In FIG. 3, these so-called "plating stubs" are designated with reference numerals 24.

As noted above, the presence of plating stubs 24 can have not-insignificant adverse effects upon the electrical characteristics and performance of PCB 10. For example, an electrical signal conducted on a given trace 12 to a bond pad 14 will also be conducted along the length of plating stub 24 to its terminus 26. Those of ordinary skill in the art will appreciate that as a matter of impedance matching, some fraction of the signal conducted along plating stub 24 may be reflected at the terminus 26 back towards bond pad 14 and trace 12. Depending upon the length of plating stub 24, such reflected signals can have adverse effects upon the electrical performance of PCB 10. Moreover, due to the difficulties in achieving consistent and precise alignment of the mask applied during the plating bus bar decoupling process, the lengths of plating stubs 24 are likely to differ from PCB to PCB. Such process variation makes it difficult to take into account the electrical effects of plating stubs 24, even if their presence is anticipated by the PCB designer.

Figure 4:
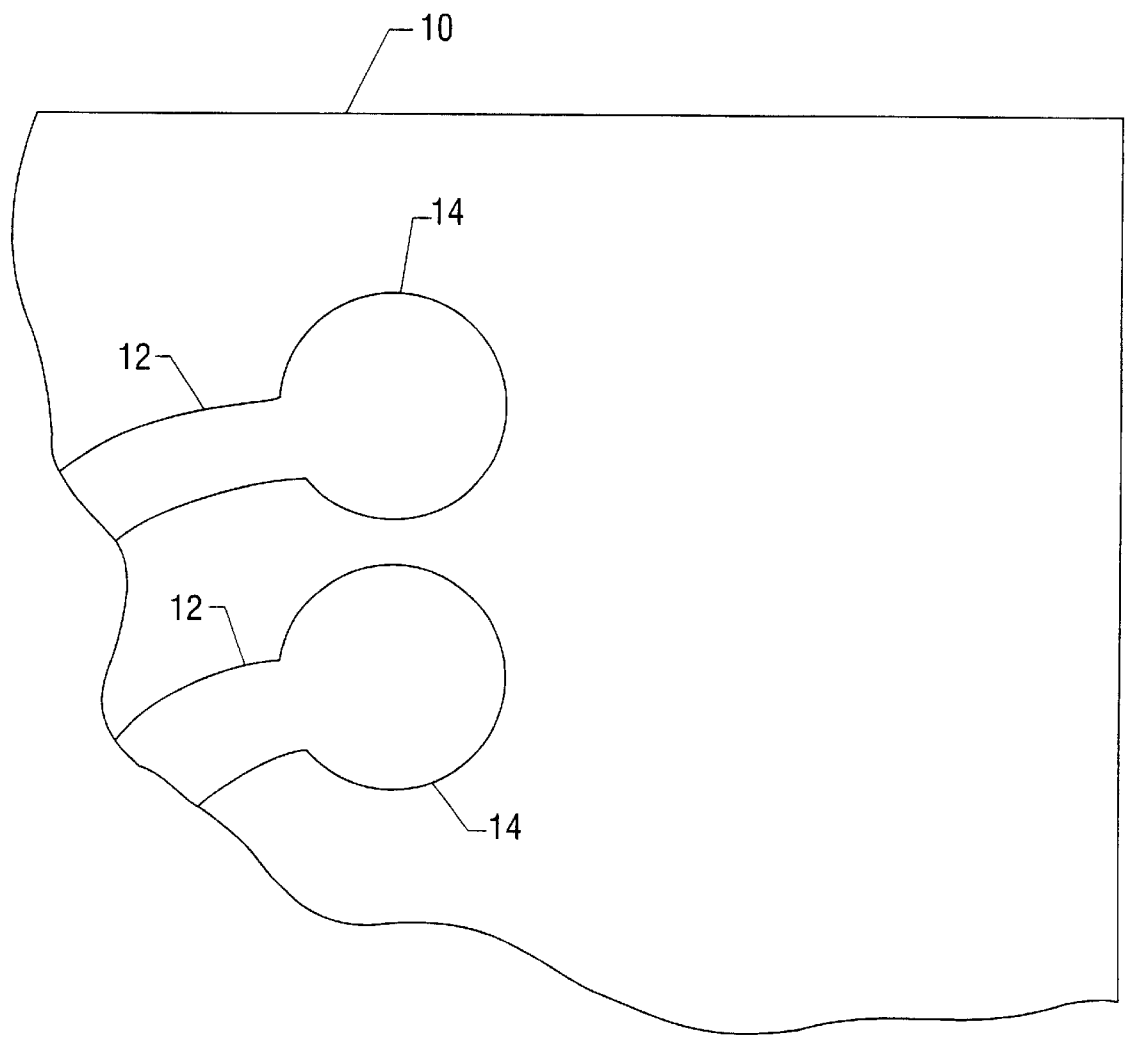
FIG. 4 is a view of a portion of a printed circuit board in accordance with one embodiment of the invention.

Turning now to FIG. 4, there is shown a PCB 10' fabricated in accordance with one embodiment of the invention. PCB 10' is characterized most notably by the absence of the remnants of plating bus bars and by the absence of plating stubs. By comparing the embodiment of FIG. 4 with that of FIGS. 1–3, the large area of the substrate that is not occupied by plating bus bars and plating stubs is plainly apparent.

To accomplish bond pad plating without plating bus bars, the present invention relies upon the use of an at least partially conductive substrate for the PCB. In particular, the present invention contemplates the use of a PCB substrate that has a conductivity within a range sufficient to cause a plating voltage applied at any location thereon to be conducted to each trace and bond pad patterned thereon. By so doing, the need for plating bus bars and a plating contact is eliminated, along with the disadvantageous side effects of those elements. Notably, by eliminating the plating bus bars, PCBs can be accurately reproducable with consistent electrical characteristics.

Several methods are contemplated for providing conductive PCB substrates in accordance with the principles of the present invention. One method is to provide a PCB substrate impregnated with a conductive material in an amount sufficient to achieve the desired level of conductivity. Presently, it is contemplated that a conductivity in the range from $10^6$ to $10^8$ Ω per square centimeter would be preferable. Such a conductivity level would be sufficient for the purposes of conducting the relatively high voltages necessary for the purposes of the electrolytic plating process, but low enough to not interfere electrically with the operation of the PCB with the much smaller semiconductor device voltages.

In one embodiment, the PCB substrate 10' may be composed of a carbon-impregnated material, such as a carbon-filled epoxy. In another embodiment, PCB substrate 10' is composed of a material, such as polyimide, which must be cured. Polyimide is a cross-linked monomer that is formed into a polymer through a thermal or ultraviolet light process. It has been shown that in a partially cured state, polyimide is conductive, but once fully cured, is non-conductive. In accordance with one embodiment, therefore, PCB substrate 10' is only partially cured prior to the spot-plating operation. Thereafter, curing is completed, rendering the substrate essentially non-conductive.

Other materials commonly used as PCB substrates include FR4 and FR5. In one embodiment of the invention, a contaminant is introduced into the substrate material in its liquid state. Preferably, the contaminant is a material whose conductivity degenerates during the process of curing the PCB substrate. Examples of such materials include the curing agents and activators which are acids until polymerized with temperature. Again, the substrate is preferably only partially cured prior to the spot-plating operation, with the curing process being brought to completion after spot-plating is performed.

In another embodiment of the invention, it is contemplated that the partially-conductive substrate may be provided for the purposes of not only of spot-plating onto the traces, but also for electroplating the traces themselves onto the circuit board substrate. Those of ordinary skill in the art having the benefit of the present disclosure will readily appreciate that by providing a partially-conductive substrate, the process of electroplating the traces onto the substrate in the desired pattern is greatly simplified as compared with prior art techniques for so doing.

From the foregoing detailed description of a specific embodiment of the invention, it should be apparent that a method and apparatus for spot-plating selected areas of a printed circuit board without the need for plating bus bars and plating contacts has been disclosed. Although specific embodiments of the invention have been disclosed herein in some detail, this has been done solely for the purposes of illustrating various aspects and features of the invention, and is not intended to be limiting with respect to the scope of the invention. It is contemplated that various substitutions, alterations, and/or modifications, including but not limited to those design alternatives which might have been specifically noted in this disclosure, may be made to the disclosed embodiment without departing from the spirit and scope of the invention as defined in the appended claims.

What is claimed is:

1. A method of spot-plating selected areas of metal traces on a printed circuit board, comprising:
    (a) providing a partially-conductive printed circuit board substrate having said metal traces formed thereon;
    (b) applying a plating voltage to said substrate; and
    (c) performing an electrolytic plating operation on said substrate;
    (d) curing said substrate thereby rendering said substrate substantially non-conductive.

2. A method in accordance with claim 1, wherein said partially-conductive printed circuit board substrate has a conductivity in a range between $10^6$ and $10^8$ Ω per square centimeter prior to said step (c) of performing an electrolytic plating operation on said substrate.

3. A method in accordance with claim 1, wherein curing comprising:
    heat-treating or ultraviolet light curing.

4. A method of applying metal traces to a printed circuit board substrate, comprising:
    (a) providing a partially conductive substrate;
    (b) applying an electroplating voltage to said substrate;
    (c) electroplating said metal traces to said substrate using said electroplating voltage.
    (d) while said electroplating voltage is applied to said substrate, performing an electrolytic spot-plating operation on said traces;
    (e) curing said substrate, thereby rendering said substrate substantially non-conductive.

5. A method in accordance with claim 4, curing comprising:
    heat-treating.

* * * * *